US007183854B2

(12) United States Patent
Regier et al.

(10) Patent No.: US 7,183,854 B2
(45) Date of Patent: Feb. 27, 2007

(54) PROGRAMMABLE GAIN INSTRUMENTATION AMPLIFIER INCLUDING A COMPOSITE AMPLIFIER FOR LEVEL SHIFTING AND IMPROVED SIGNAL-TO-NOISE RATIO

(75) Inventors: Christopher G. Regier, Austin, TX (US); Clayton H. Daigle, Austin, TX (US); Lauren Sjoboen, Austin, TX (US); Antony Wangsanata, Austin, TX (US)

(73) Assignee: National Instruments Corporation, Austin, TX (US)

( * ) Notice: Subject to any disclaimer, the term of this patent is extended or adjusted under 35 U.S.C. 154(b) by 124 days.

(21) Appl. No.: 11/108,357

(22) Filed: Apr. 18, 2005

(65) Prior Publication Data
US 2005/0195027 A1   Sep. 8, 2005

Related U.S. Application Data

(60) Provisional application No. 60/602,232, filed on Aug. 17, 2004.

(51) Int. Cl.
*H03G 3/10* (2006.01)
(52) U.S. Cl. .................... 330/284; 330/254
(58) Field of Classification Search ............. 330/284, 330/254, 260, 258, 298, 207
See application file for complete search history.

(56) References Cited

U.S. PATENT DOCUMENTS

| | | | |
|---|---|---|---|
| 5,272,627 A | 12/1993 | Maschhof et al. | |
| 5,329,281 A * | 7/1994 | Baumgartner et al. | 341/139 |
| 5,555,287 A * | 9/1996 | Gulick et al. | 455/557 |
| 5,764,546 A | 6/1998 | Bryant et al. | |
| 5,847,667 A | 12/1998 | Baek | |
| 6,067,584 A | 5/2000 | Hayles et al. | |
| 6,096,094 A | 8/2000 | Kay et al. | |
| 6,166,673 A | 12/2000 | Odom | |
| 6,243,738 B1 | 6/2001 | Hayles et al. | |
| 6,380,874 B1 | 4/2002 | Knudsen | |
| 6,700,807 B1 | 3/2004 | Williams et al. | |
| 6,729,584 B2 * | 5/2004 | Ireland | 246/122 A |
| 6,823,283 B2 | 11/2004 | Steger et al. | |
| 2003/0038842 A1 | 2/2003 | Peck et al. | |
| 2003/0040881 A1 | 2/2003 | Steger et al. | |
| 2003/0074489 A1 | 4/2003 | Steger et al. | |
| 2003/0163298 A1 | 8/2003 | Odom et al. | |

\* cited by examiner

*Primary Examiner*—Henry Choe
(74) *Attorney, Agent, or Firm*—Meyertons Hood Kivlin Kowert & Goetzel, P.C.; Jeffrey C. Hood; Mario J. Lewin

(57) ABSTRACT

A PGIA for use in measurement devices (e.g., data acquisition device) including a composite amplifier for level shifting and improved signal-to-noise ratio. The composite amplifier may level shift from a constant common mode voltage to a lower common mode voltage with a large voltage swing. The large output signal swing of the PGIA may allow excellent signal-to-noise ratio. Additionally, input op-amps of the PGIA may be bootstrapped so that their supply rails move according to an input signal of the PGIA. The PGIA may also include protection circuitry to protect components from damage, e.g., due to over-current conditions, and to keep all op-amps in proper closed loop operation. Furthermore, the PGIA may include DA compensation circuitry to cancel some dielectric absorptions effects and improve a step response of the PGIA and CMRR enhancement circuitry to increase symmetry at inputs of the PGIA and improve a CMRR associated with the PGIA.

37 Claims, 7 Drawing Sheets

PROGRAMMABLE GAIN INSTRUMENTATION AMPLIFIER INCLUDING A COMPOSITE AMPLIFIER FOR LEVEL SHIFTING AND IMPROVED SIGNAL-TO-NOISE RATIO

PRIORITY CLAIM

This application claims benefit of priority of U.S. provisional application Ser. No. 60/602,232 titled "Programmable Gain Instrumentation Amplifier Having Bootstrapped Inputs and a Composite Op-Amp for Level Shifting", filed Aug. 17, 2004.

BACKGROUND OF THE INVENTION

1. Field of the Invention

This invention relates generally to measurement and data acquisition systems and, more particularly, to programmable gain instrumentation amplifier (PGIA) design.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal conditioning devices which receive the field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a unit under test.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor.

In a measurement or data acquisition process, analog signals may be received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. When a measurement system generates an analog output signal, the computer system may generate digital signals that are provided to one or more digital to analog converters (DACs) in the DAQ device. The DACs convert the digital signal to an analog output signal that is used, e.g., to stimulate a UUT.

The input stage of many measurement devices (e.g., a DAQ device) typically consists of one or more instrumentation amplifiers. Generally, analog signals that are received at a DAQ device are first routed from a particular channel via a multiplexer. The signals may then enter an instrumentation amplifier, typically a programmable gain instrumentation amplifier (PGIA). A distinctive feature of an instrumentation amplifier is that it provides very high input impedance and gain. A PGIA typically applies a specified amount of gain to an input signal, which amplifies or attenuates the signal and ensures proper A/D conversion. The PGIA may also convert differential input signals applied to the DAQ board to a single-ended output so that the ADC can correctly digitize the data.

As the resolution and speed of ADCs increase, the accuracy, noise, and speed requirements on PGIAs may similarly increase. Some common PGIA designs may not be able to meet the additional requirements. One conventional design is a three op-amp PGIA design. This design may suffer from a decrease in bandwidth as the gain is increased. Its accuracy and linearity may also suffer at high gains due to the reduction of negative feedback necessary to effect higher gain. Also, the rejection of common-mode signals may be limited by resistor matching.

Other PGIA designs typically suffer from output offset errors and drifts due to matching errors between multiple DC current sources and mirrors. These current sources and mirrors may also contribute a significant amount of output-referred noise. Also, in most PGIA designs, as more components are added to the input stage, the settling time of the overall amplifier may suffer significantly. Each component may introduce additional delays due to parasitics, some of which exhibit dielectric absorption effects, and therefore may change the overall time constants and step response of the amplifier. Moreover, device tolerances, mismatches, and any asymmetrical topology in the PGIA may result in a relatively low common mode rejection ration (CMRR).

Furthermore, PGIAs may be susceptible to overload-induced errors, such as saturation recovery time or excessive current draw. Insufficiently protected PGIAs may pass along overload conditions to the next stage of circuitry, typically the ADC, which may not be designed to handle such overload conditions.

SUMMARY OF THE INVENTION

Various embodiments of an instrumentation amplifier for use in a measurement device are disclosed. In one embodiment, the instrumentation amplifier may be configured as a programmable gain instrumentation amplifier (PGIA). The PGIA may be included in any type of measurement device, e.g., a data acquisition (DAQ) device. It is noted that a measurement device may include one or more of the PGIAs. In one embodiment, the PGIA may include a composite amplifier for level shifting and improved signal-to-noise ratio. Also, the PGIA may include bootstrapped input op-amps and protection circuitry. Furthermore, the PGIA may include dielectric absorption (DA) compensation circuitry and common-mode rejection ratio (CMRR) enhancement circuitry.

In one embodiment, the composite amplifier comprised in the PGIA may level shift from a relatively high constant common mode voltage to a lower common mode voltage with a large voltage swing. The relatively high constant voltage may correspond to the voltage at an input terminal of the composite amplifier. In one example, a composite amplifier may level shift from a constant common mode voltage of twelve volts to a lower common mode voltage of two volts, and the signal superimposed on this lower common mode voltage may have a relatively large voltage swing of twenty volts.

Some of the advantages of embodiments of the PGIA compared to prior art PGIA designs (e.g., the prior art designs described above) are the following. First, one of the current sources typically used in prior art designs to level shift the "output" signal of the differential stage may be eliminated in embodiments of the PGIA. Second, embodiments of the PGIA may eliminate a voltage-mode processing step of some prior art designs and instead implement current-mode processing. Third, the output signal swing of embodiments of the PGIA may be relatively large (e.g., 20V) compared to some prior art designs, which may allow excellent signal-to-noise ratio. Fourth, the large output signal swing of embodiments of the PGIA may allow the PGIA to use a "sloppy" (e.g., within ±500 mV) voltage clamp that may perform as a precision clamp.

In one embodiment, a negative input op-amp and a positive input op-amp of the PGIA may be bootstrapped, which means that their supply rails move according to the input signal. The step response of an op-amp with bootstrapped power supplies may be considerably better than that of an op-amp with fixed supplies because the op-amp with fixed supplies does not "see" the step. The PGIA may also include the protection circuitry to protect the components of the PGIA from damage, e.g., due to over-current or over-voltage conditions, and to keep all the op-amps in proper closed loop operation.

In one embodiment, the PGIA may include dielectric absorption (DA) compensation circuitry to cancel some of the dielectric absorptions effects and improve the step response of the PGIA. When a step function is applied to the negative input of the PGIA, the DA compensation circuitry may generate slow-settling tails to compensate for the error caused by undesired dielectric absorption. The DA compensation circuitry may compensate for the error with a first order approximation to the inverse of the dielectric absorption error. The PGIA may also include common-mode rejection ratio (CMRR) enhancement circuitry to increase symmetry at the inputs of the PGIA and improve the CMRR associated with the PGIA. The CMRR enhancement circuit may delay an input signal received at the negative input terminal of the PGIA a particular amount such that the input signal received at the negative input terminal will be in phase with an input signal received at the positive input terminal of the PGIA.

Figure 1:
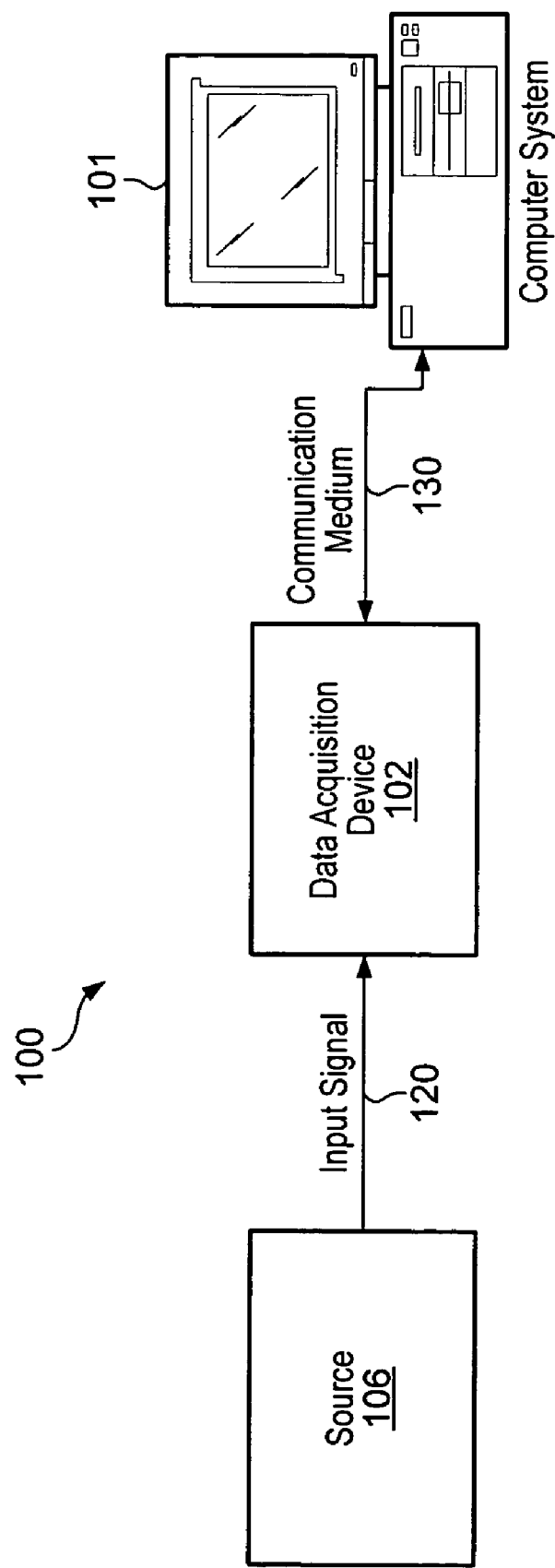
FIG. 1 is a diagram of one embodiment of a computer-based measurement system or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Data Acquisition System

FIG. 1 is a diagram of one embodiment of a computer-based measurement system or data acquisition system 100. The data acquisition system 100 may comprise a computer system 101, which may be coupled to a measurement device, referred to as data acquisition (DAQ) device 102, through a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, MXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor, which is comprised in a unit under test (UUT). In this example, the DAQ device 102 may receive temperature reading from the temperature sensor and convert the analog data to digital form to be sent to the computer system 101 for analysis. Additionally, the DAQ device 102 may receive a digital input, e.g., a binary pattern, from the external source 106 (e.g., a UUT). Furthermore, the DAQ device 102 may also produce analog or digital signals, e.g., for stimulating the UUT.

The computer system 101 may be operable to control the DAQ device 102. For example, the computer system 101 may be operable to direct the DAQ device 102 to perform an acquisition, and may obtain data from the DAQ device 102 for storage and analysis therein. Additionally, the computer system 101 may be operable to send data to the device 102 for various purposes, such as for use in generating analog signals used for stimulating a UUT.

The computer system 101 may include a processor, which may be any of various types, including an X86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Data Acquisition Device

Figure 2:
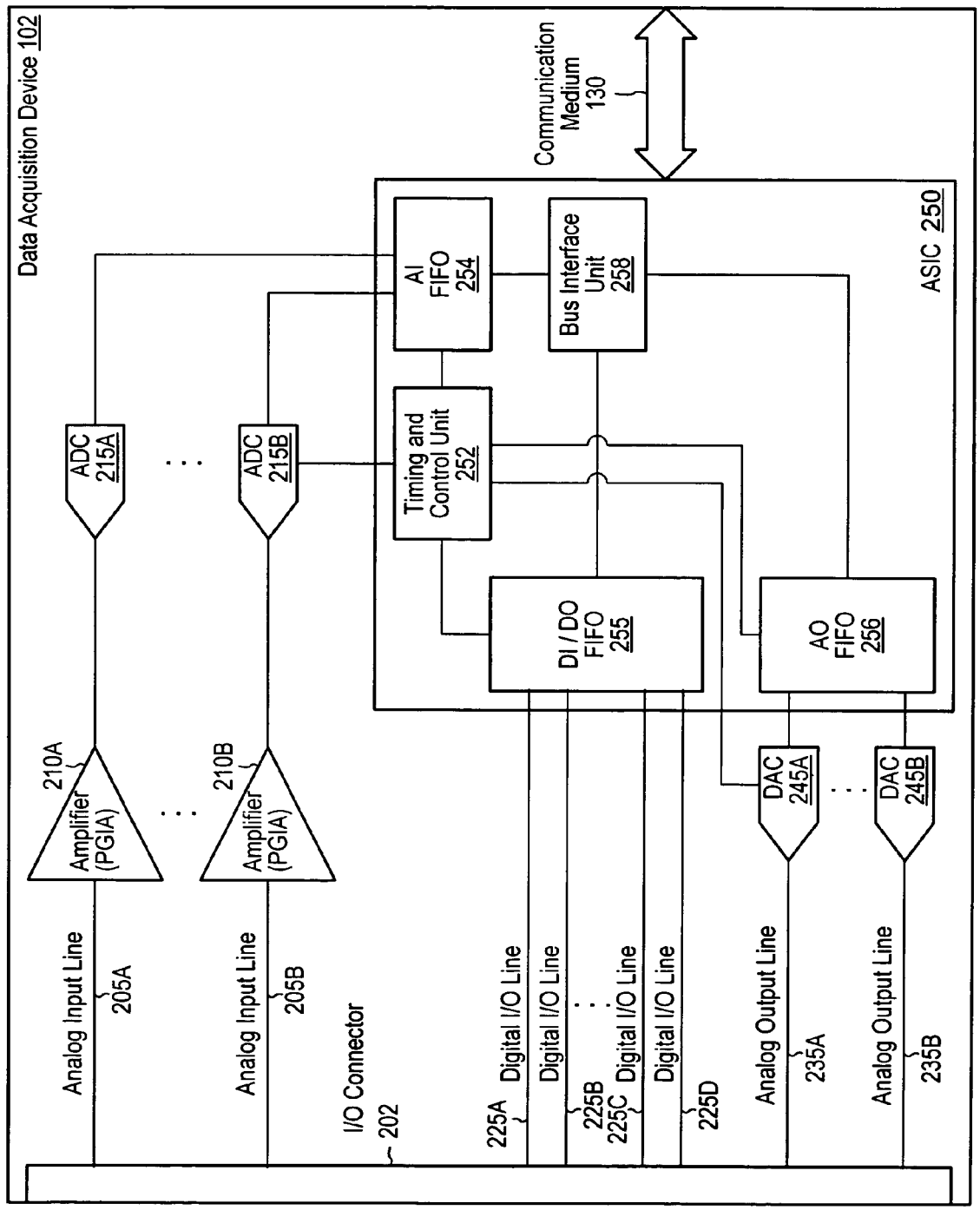
FIG. 2 is a block diagram of one embodiment of a data acquisition (DAQ) device.

FIG. 2 is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., MXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, instrumentation amplifiers 210A and 210B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, and communication medium 130. It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

The DAQ device 102 may receive and send digital and/or analog data via the input and output lines of the I/O connector 202. For example, the I/O connector 202 may be coupled to a signal source (e.g., source 106 of FIG. 1) comprised in a UUT to receive analog signals. The I/O connector 202 may comprise analog input lines 205A and 205B, which may convey the received analog signals to instrumentation amplifiers 210A and 210B. It is noted however that in other embodiments the DAQ device 102 may comprise any number of analog input lines, e.g., three or more analog input lines.

In one embodiment, the instrumentation amplifiers 210A and 210B may be configured as programmable gain instrumentation amplifiers (PGIAs). PGIAs are typically differential amplifiers having a high input impedance and a gain that is adjustable through the variation of a single resistor. PGIAs may apply a specified amount of gain to the input signal to ensure proper analog-to-digital conversion. Also, PGIAs may convert differential input signals into single-ended outputs, which may be needed for the ADC (e.g., ADC 215A) to correctly digitize the data. In one embodiment, each of the PGIAs 210A and 210B may include a composite amplifier for level shifting and improved signal-to-noise ratio. In one example, the composite amplifier may level shift from a constant common mode voltage to a lower common mode voltage with a large voltage swing, as will be described further below with reference to FIG. 3. In addition, the PGIAs may include protection circuitry to protect the components of the PGIAs from damage due to, e.g., over-current or over-voltage conditions, and to keep all the op-amps in proper closed loop operation. Furthermore, each of the PGIAs 210A and 210B may include dielectric absorption (DA) compensation circuitry to cancel some of the dielectric absorptions effects and improve the step response of the PGIAs and common-mode rejection ratio (CMRR) enhancement circuitry to improve the CMRR associated with the PGIAs, as will be described further below with reference to FIG. 5. It is noted that in other embodiments the data acquisition device 102 may comprise any number of amplifiers, e.g., a single PGIA or four PGIAs.

The output of instrumentation amplifier 210A may be connected to ADC 215A, which may digitize the analog signals. ADCs are devices that convert a continuously varying (analog) signal into a discrete (digital) signal. The resolution of the ADC typically indicates the number of discrete values it can produce. For example, if the ADC has an eight-bit resolution, the ADC may be able to encode an analog input to one of 256 discrete values (since $2^8 = 256$). Each discrete value is derived by sampling the analog signal at particular times (e.g., a periodic rate). More specifically, the signal values are measured and stored at particular times. An ADC typically includes a sample and hold circuit, which holds the input value constant during the time the ADC performs the analog-to-digital conversion, since the ADC cannot make an instantaneous conversion. It is noted however that in other embodiments the DAQ device 102 may comprise any number of ADCs, for example, the DAQ device 102 may include a single ADC or four ADCs.

After the signals are digitized, the ADC 215A may send the digital signals to the ASIC 250. In one embodiment, the ASIC 250 may be a digital IC, which may be configured to perform the timing and data control functions for the DAQ device 102. It is noted however that in other embodiments other types of timing and data control ICs may be used. The ASIC 250 may include a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

When the ASIC 250 receives the digitized signals from the one or more ADCs, the data may be stored in AI FIFO buffer 254. FIFO buffers are storage devices that output the stored data in the order the data was received. After being stored in the AI FIFO buffer 254, the digitized data may be sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the digitized data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. DACs are devices that convert discrete (digital) signals into continuously varying (analog) signals. For example, if an analog signal was initially converted to digital form, a DAC may be able to reproduce the analog signal if provided with the digital data. It is noted that the DAQ device 102 may comprise any number of DACs, for example, other embodiments may include a single DAC or four DACs. After the digital data is converted to analog form, the analog signals may be sent to the I/O connector 202 via the analog output line 235A.

PGIA with Composite Amplifier and Protection Circuitry

Figure 3:
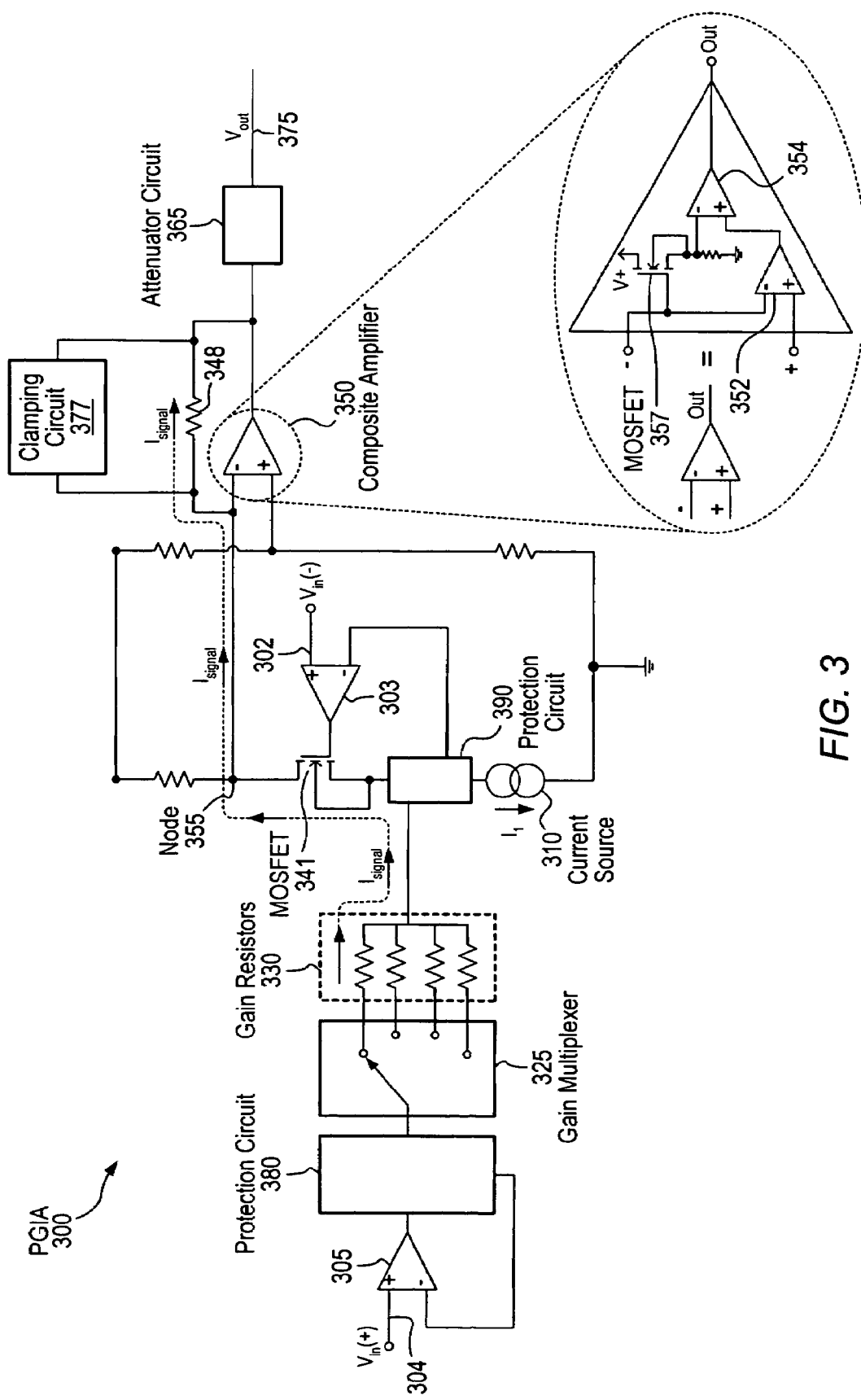
FIG. 3 is a circuit diagram of one embodiment of a programmable gain instrumentation amplifier (PGIA) including a composite amplifier for level shifting and protection circuitry.

Turning now to FIG. 3, a circuit diagram of one embodiment of a programmable gain instrumentation amplifier (PGIA) 300 including a composite amplifier 350 for level shifting is shown. The PGIA 300 may be an integrated circuit (IC), for example, an analog IC. The PGIA 300 may be included in a measurement device, e.g., may be the instrumentation amplifier 210A comprised in the data acquisition device 102 of FIG. 2. It is noted however that in other embodiments the PGIA 300 may be included in any measurement device, such as a computer-based instrument, a data acquisition device or board, a programmable logic device (PLD), an actuator, or other types of devices for acquiring or generating data. The measurement device may be a card or board plugged into one of the I/O slots of a computer system, or a card or board plugged into a chassis, or an external device. The PGIA 300 may include the composite amplifier 350 for level shifting and improved signal-to-noise ratio, as will be further described below.

In one embodiment, as shown in FIG. 3, the PGIA 300 may comprise a negative input terminal (i.e., $V_{in}(-)$) 302, a positive input terminal (i.e., $V_{in}(+)$) 304, an output terminal (i.e., $V_{out}$) 375, a negative input op-amp 303, a positive input op-amp 305, a current source 310, a gain multiplexer 325, gain resistor circuit 330, a metal-oxide semiconductor field effect transistor (MOSFET) 341, a node 355, a resistor 348, a voltage clamping circuit 377, an attenuator circuit 365, a protection circuit 380, a protection circuit 390, and the composite amplifier 350. The negative input op-amp 303 may include a noninverting input terminal, an inverting input terminal, and an output terminal. The noninverting input terminal of the negative input op-amp 303 may be coupled to the negative input terminal 302 of the PGIA 300. Similarly, the positive input op-amp 305 may also include a noninverting input terminal, an inverting input terminal, and an output terminal. The noninverting input terminal of the positive input op-amp 305 may be coupled to the positive input terminal 304 of the PGIA 300.

In one embodiment, the negative input op-amp 303 and the positive input op-amp 305 may be configured as source followers. The output terminal of the negative input op-amp 303 may be coupled to the MOSFET 341 (e.g., the gate terminal). Also, the protection circuit 390 may be connected to the gain resistor circuit 330, the MOSFET 341 (e.g., the source terminal), the inverting terminal of the negative input op-amp 303, and the current source 310. Furthermore, the gain multiplexer 325 may be coupled to the protection circuit 380 and the gain resistor circuit 330. In one embodiment, the gain resistor circuit 330 may comprise a plurality of gain resistors (e.g., six) having various resistance values (e.g., 50Ω, 100Ω, 250Ω, 500Ω, 1 kΩ, and 5 kΩ). The protection circuit 380 may be connected to the output terminal and the inverting terminal of the positive input op-amp 305.

In addition, the composite amplifier 350 may include a first and a second input terminal and an output terminal. The output terminal of the composite amplifier 350 may be coupled to the output terminal 375 of the PGIA 300. In one embodiment, as shown in FIG. 3, the output terminal of the composite amplifier 350 may be coupled to the attenuator circuit 365, which may be connected to the output terminal 375 of the PGIA 300. The composite amplifier 350 may comprise a first op-amp 352, a second op-amp 354, and a MOSFET 357. In one embodiment, an inverting input terminal of the first op-amp 352 may be coupled to the first input terminal of the composite amplifier 350 and to the MOSFET 357 (e.g., the gate terminal), a noninverting input terminal of the first op-amp 352 may be coupled to the second input terminal of the composite amplifier 350, and an output terminal of the first op-amp 352 may be coupled to a noninverting terminal of the second op-amp 354. Also, an inverting terminal of the second op-amp 354 may be coupled to the MOSFET 357 (e.g., the source terminal), and an output terminal of the second op-amp 354 may be coupled to the output terminal of the composite amplifier 350. In addition, the node 355 may be connected to the first terminal of the composite amplifier 350 and to the MOSFET 341 (e.g., the drain terminal). In one embodiment, one of the first op-amp 352 and the second op-amp 354 may be a precision op-amp and the other may be a high-speed op-amp.

In one embodiment, the composite amplifier 350 may include a feedback loop connecting the output terminal and the first terminal of the composite amplifier 350. The feedback loop may include the resistor 348. Also, in one embodiment, the voltage clamping circuit 377 may be coupled between the output terminal and the first terminal of the composite amplifier 350 and may be coupled to the attenuator circuit 365.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in some embodiments, the MOSFETs 341 and 357 may be other types of transistors (e.g., a JFET) and/or the number of resistors may vary, e.g., the resistor 348 may represent the combination of two or more resistors in series or in parallel. In another example, the PGIA 300 may instead be an instrumentation amplifier having a single gain resistor instead of the gain resistor circuit 330.

The PGIA 300, as shown in FIG. 3, may sense two sides of a gain resistor (e.g., comprised in the gain resistor circuit 330), which is selected by the gain multiplexer 325, to provide a precision signal current, e.g. current $I_{signal}$. The precision signal current may be superimposed on a larger bias current, e.g., current $I_1$, which may allow bipolar operation. The bias current may be generated from wide supply rails to allow for user headroom, causing the "output" signal of the differential stage to exist at a relatively high common mode voltage with respect to device ground. In one embodiment, the relatively high common mode voltage may be a constant voltage (e.g., 12V) and may correspond to the voltage at the node 355, which is coupled to the first input terminal of the composite amplifier 350. In order for an ADC (e.g., the ADC 245A of FIG. 2) to use this signal, it may be level shifted back down to a small common mode voltage (e.g., 2V) by the composite amplifier 350 and scaled appropriately.

Some of the advantages of embodiments of the PGIA 300 compared to prior art PGIA designs (e.g., the prior art designs described above) are the following. First, one of the current sources typically used in prior art designs to level shift the "output" signal of the differential stage may be eliminated in embodiments of the PGIA 300. Thus, in one embodiment, only one current source (e.g., the current source 310) may be needed in the PGIA 300 for biasing, which may improve noise as well as drift and accuracy. Second, embodiments of the PGIA 300 may eliminate a voltage-mode processing step of some prior art designs and instead implement current-mode processing. The PGIA 300 may convert the differential input voltage into a current at the left branch of the PGIA 300, and the current may then be forced straight from the left branch of the PGIA 300 (via the constant voltage node 355) to the composite amplifier 350, where the current is translated to a voltage. Some prior art designs may use at least one extra voltage-mode processing step within the PGIA to convey the signal current to a ground referenced current-to-voltage (I-V) converter. In these prior art designs, the differential input voltage is translated to a current at the left branch of the PGIA, then to a voltage that is mirrored to the right branch of the PGIA, then the voltage is converted to a current, and finally the current is converted to a voltage at the I-V converter. Due to the current-mode processing described above, the PGIA 300 may take fewer steps to output the necessary voltage from the composite amplifier 350, which may result in less signal noise and distortion.

Third, the output signal swing of embodiments of the PGIA 300 may be relatively large (e.g., 20V) compared to prior art designs, which may allow excellent signal-to-noise ratio. In some prior art PGIA designs, the signal-to-noise ratio may be poor due to the output signal swing being relatively small (e.g., 1V). Fourth, the large output signal swing of embodiments of the PGIA 300 may allow the design to use a "sloppy" (e.g., within ±500 mV) voltage clamp (e.g., voltage clamping circuit 377) that may perform as a precision clamp (e.g., within ±100 mV) when the signal is divided down (e.g., divide by 5) by, for example, the attenuator circuit 365. Therefore, in one example, even though the voltage clamping circuit 377 may be "sloppy" and result in ±500 mV of uncertainty, after the signal is divided down by the attenuator circuit 365 the uncertainty is substantially reduced to ±100 mV. It is noted that some embodiments of the PGIA 300 may offer additional advantages over prior art PGIA designs.

The PGIA 300 may eliminate an extra voltage-mode processing step by the use of the composite amplifier 350, whose input common mode voltage remains relatively high, e.g., at 12V (i.e., to allow 11V working voltage at the user input). Also, the output of the composite amplifier 350 has a relatively small common mode component (i.e., to allow easy scaling for the ADC) with a large voltage swing. In one example, a composite amplifier may level shift from a constant common mode voltage of twelve volts to a lower common mode voltage of two volts, and the signal superimposed on this lower common mode voltage may have a relatively large voltage swing of twenty volts. This effectively combines the level shifting, scaling, and current-to-voltage conversion into a single stage. It is noted that in some embodiments the node 355 may be held constant at other relatively large voltage values, e.g., a voltage value greater than or equal to 10V. In other embodiments, the node 355 may be held constant at a voltage value greater than or equal to 8V. In one embodiment, the voltage at node 355 may be relatively constant, e.g., within ±1V. It is also noted that in some embodiments the composite amplifier 350 may output a signal with other relatively large voltage swings, for example, a voltage swing of greater than or equal to 20V. In other embodiments, the composite amplifier 350 may output a signal with a voltage swing of greater than or equal to 16V.

In one embodiment, the negative input op-amp 303 and the positive input op-amp 305 of the PGIA 300 may be bootstrapped, which means that their supply rails move according to the input signal. In one example, the power rails may be tied to the input voltage plus or minus a constant (e.g., ±4V) to allow some headroom. The step response of an op-amp with bootstrapped power supplies may be considerably better than that of an op-amp with fixed supplies because the op-amp with fixed supplies does not "see" the step. Bootstrapped inputs may help keep the input op-amps out of saturation during slewing conditions because the input may always be at about the same potential with respect to its rails (i.e., the power rails limits may not be breached).

In one example, the PGIA 300 may include a multiplexer that selects one of several channels associated with one of several gain resistors (e.g., gain resistors 330) used to vary the gain. The reading of one channel should not affect the reading of another channel. When you switch from a first channel to a second channel, the circuit typically needs time to settle (due to the step that is "seen"). Bootstrapping the negative input op-amp 303 and the positive input op-amp 305 may allow the PGIA 300 to switch from the first channel to the second channel effectively in a relatively short amount of time (i.e., improves the settling time). The support circuitry associated with the bootstrapping function may move the power rails with the input voltage. For example, the positive power rail may be equal to the input plus 4V and the negative rail may be equal to the negative input minus 4V. This may improve the step response significantly. It is noted however that in other embodiments the 4V headroom may vary depending on the application.

Figure 4A:
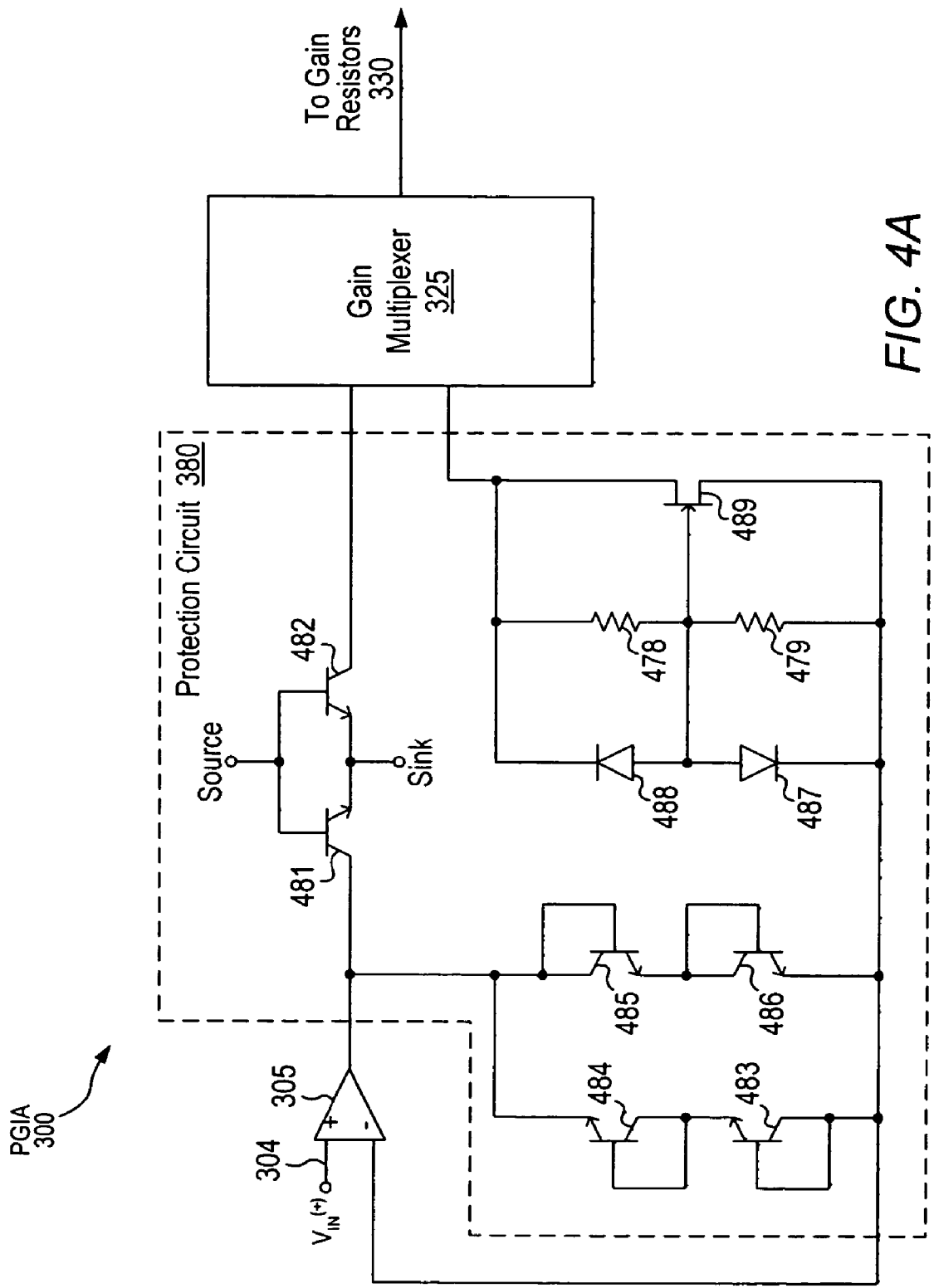
FIG. 4A is a circuit diagram of one embodiment of a portion of the PGIA 300 of FIG. 3 including a first protection circuit.
Figure 4B:
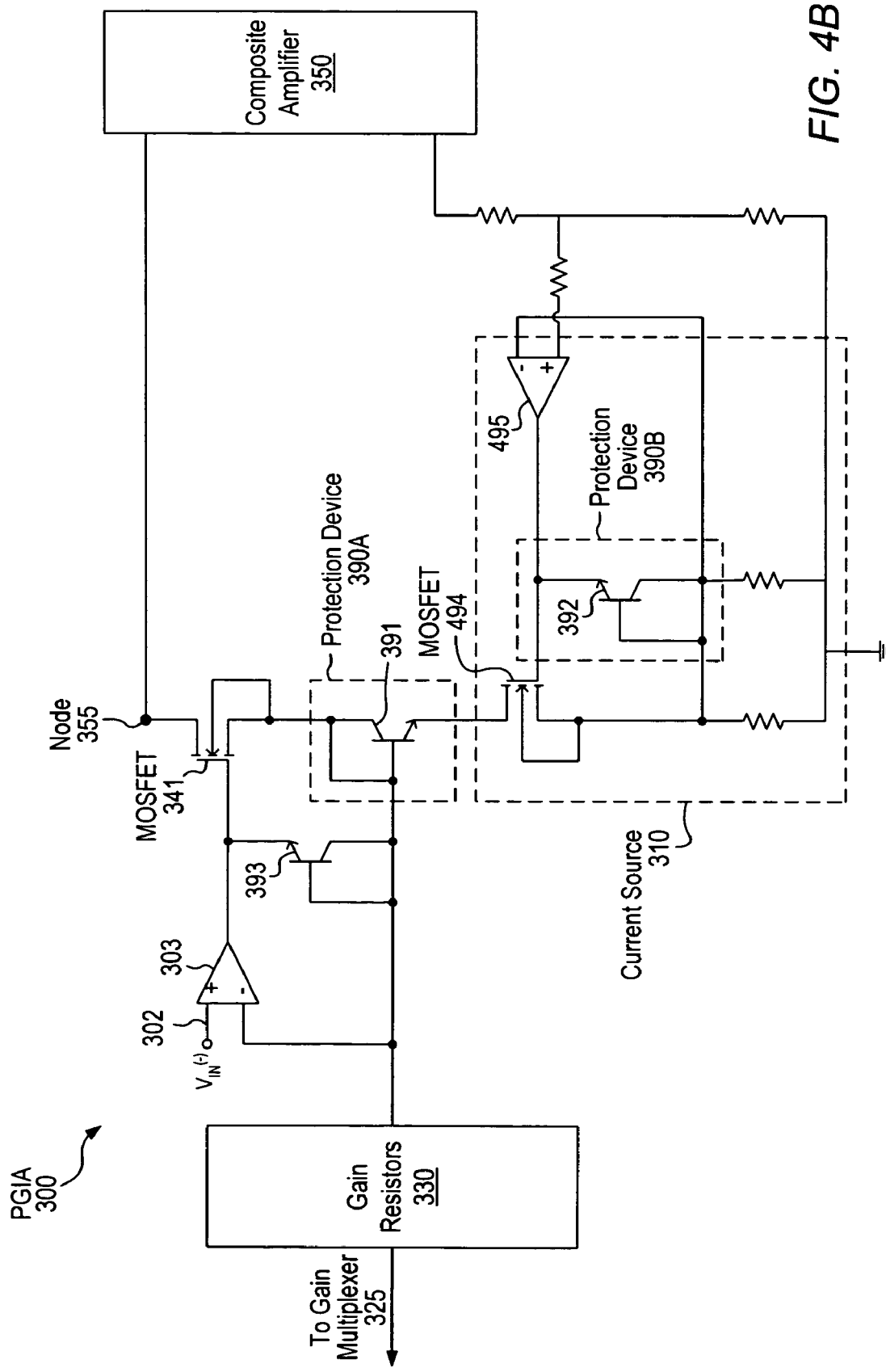
FIG. 4B is a circuit diagram of one embodiment of a portion of the PGIA 300 of FIG. 3 including a second protection circuit.

As shown in FIG. 4A and FIG. 4B, the PGIA 300 may also include the protection circuit 380 and the protection circuit 390 to protect the components of the PGIA 300 from damage and to keep all the op-amps in proper closed loop operation (i.e., to speed recovery once an over-voltage is removed). Components that correspond to those shown in FIG. 3 are numbered identically for simplicity and clarity. Typically, the input signals may be clamped so that the PGIA 300 usually will not see voltages more than a diode drop above the power supplies. However, the PGIA 300 may still need additional protection (e.g., the protection circuit 380 and the protection circuit 390) from large differential voltages, especially at high gains which may cause the input op-amps 303 and 305 to dump excessive current into precision components.

The protection circuit 380 may include six bipolar junction transistor (BJT) (e.g., BJTs 481–489), two diodes (e.g., diodes 488 and 489), and one or more resistors (e.g., resistors 478 and 479) and supporting circuitry. In one embodiment, the collector of the BJT 481 may be coupled to the output terminal of the positive input op-amp 305, the emitter of the BJT 484, and the collector of the BJT 485. The emitter of the BJT 482, which is paired up with BJT 481, may be coupled to the emitter of the BJT 481, and the collector of the BJT 482 may be connected to the gain multiplexer 325. Also, the base terminal of the BJT 481 is coupled to the base terminal of the BJT 482. The emitter of the BJT 483, which is paired up with the BJT 484, may be coupled to the collector of the BJT 484, and the collector of the BJT 483 may be coupled to the inverting terminal of the input op-amp 305. The collector of the BJT 486, which is paired up with the BJT 485, may be coupled to the emitter of the BJT 485, and the emitter of the BJT 486 may be coupled to the inverting terminal of the input op-amp 305. The pair of BJT 483 and 484 (which may be configured as diodes, e.g., each of the collector terminals of the BJT 483 and the BJT 484 may be connected to the corresponding base terminal) may be connected in parallel to the pair of BJT 485 and 486 (which may also be configured as diodes, e.g., each of the collector terminals of the BJT 485 and the BJT 486 may be connected to the corresponding base terminal). Also, the diodes 487 and 488 may be coupled to the resistors 478 and 479 and to the junction field effect transistor (JFET) 489. The JFET 489 may also be coupled to the gain multiplexer 325.

The protection circuit 390 may be divided into two parts: protection device 390A and protection device 390B. The protection device 390A may include a BJT 391, which may be configured as a diode (i.e., a blocking diode), and the protection device 390B may include a BJT 392, which may also be configured as a diode. In one embodiment, the protection device 390A may be coupled to the MOSFET 341, the current source 310, and the BJT 393. In one embodiment, the protection device 390B may be coupled to the MOSFET 494 and the op-amp 495 of the current source 310. It should be noted that the components described with reference to FIG. 4A and FIG. 4B are meant to be exemplary only, and are not intended to limit the invention to any specific set of components or configurations. For example, in various embodiments, one or more of the components described may be omitted, combined, modified, or additional components included, as desired. For instance, in some embodiments, each of the BJTs 483–486 may be any type of diode, such as a zener diode.

The protection circuit 380 may be included to limit the I/O current of the positive input op-amp 305. The protection circuit 380 may be designed to isolate the positive input op-amp 305 from the rest of the PGIA 300 during overload conditions. If the input op-amp 305 is required to source or sink too much current, two current limiters (e.g, one, the pair of BJTs 481 and 482, and the other, the JFET 489, both with supporting circuitry) may turn off to sever both the output node and the feedback node of the negative input op-amp 305 from the rest of the PGIA 300 to isolate the over-current condition. Then, a pair of diodes (e.g., BJTs 485 and 486) in the feedback path of the input op-amp 305 may turn on to keep it in proper closed loop operation and prevent saturation.

In one example, if the input voltage is 10V and the gain multiplexer 325 selects the 5 kΩ resistor, then a current of 2 mA will flow through the PGIA 300, which may be below the 5 mA limit of the current limiters. However, if the gain multiplexer 325 selects the 50Ω resistor, a current of 200 mA will flow, which could damage the gain multiplexer 325. Therefore, the BJTs 481 and 482 and the JFET 489 may turn off to isolate the over-current condition. In this example, the noninverting terminal of the input op-amp 305 may be at 10V and the inverting terminal may be at 0V, so the op-amp 305 may adjust the output voltage until the inputs are the same. The output voltage may increased (e.g., up to the bootstrap limit) and the increased voltage may turn on the BJTs 485 and 486 to open the feedback path of the op-amp 305, which may result in 10V at the inverting input terminal of the op-amp 305.

The negative input op-amp 303 typically does not cause an over-current condition directly because it preferably drives the MOSFET 341, which has high input impedance. However, if the input is brought too negative, it may activate a diode (e.g., BJT 393) that will allow it to sink current directly. This condition may then activate a parasitic diode in a precision current sink output FET (e.g., MOSFET 494), which may act like a current source and may result in an over-current condition. Therefore, in one embodiment, the PGIA 300 may include the protection device 390A, which may be a blocking diode, to prevent the precision current sink to source any current. Also, the PGIA 300 may include the protection device 390B to allow the current sink op-amp (e.g., op-amp 495) to remain in proper closed loop operation once the blocking diode is activated.

PGIA with Dielectric Absorption and CMRR Enhancement Circuitry

Figure 5:
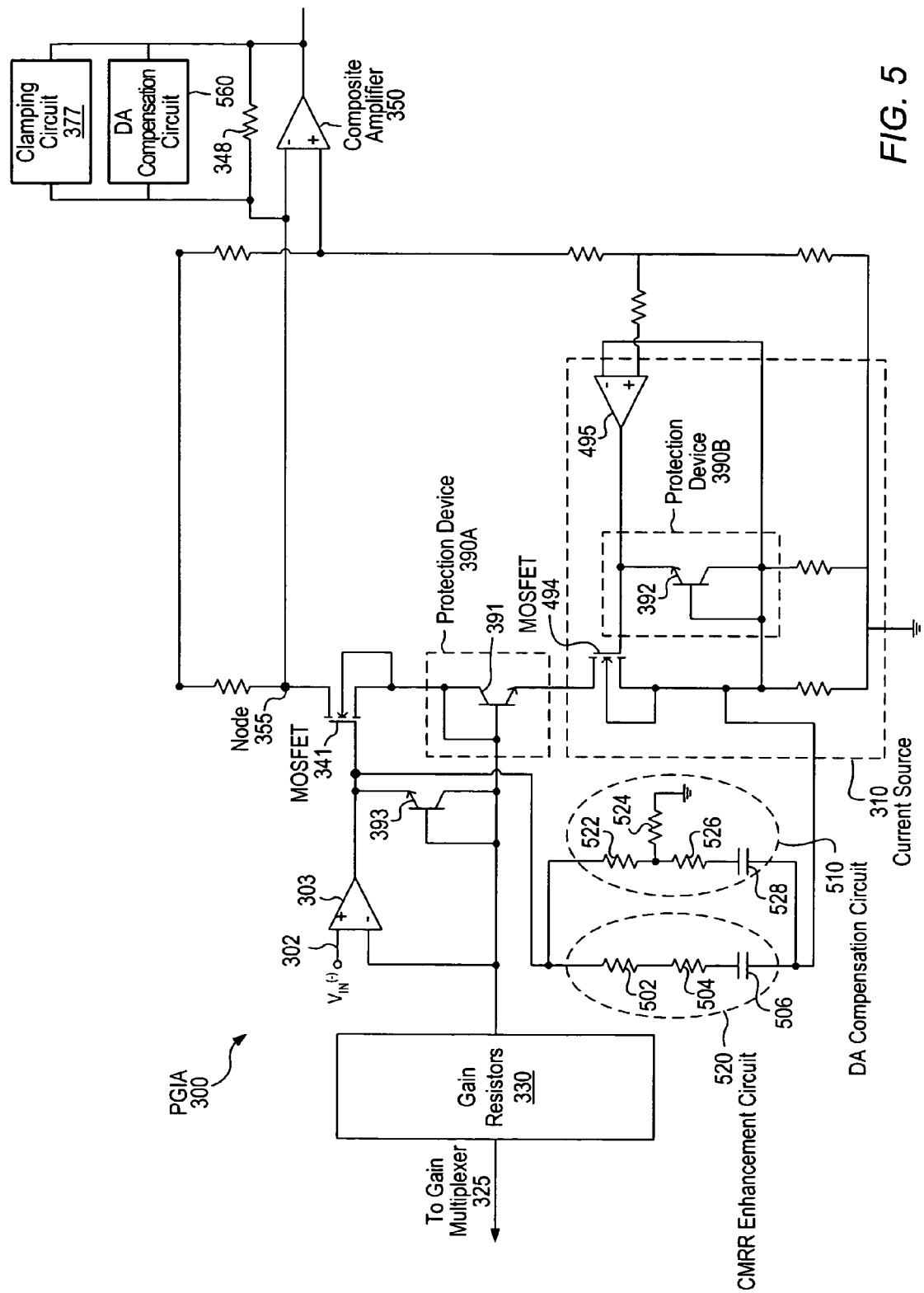
FIG. 5 is a circuit diagram of one embodiment of a portion of the PGIA 300 of FIG. 3 including dielectric absorption (DA) compensation circuitry and common mode rejection ratio (CMRR) enhancement circuitry.

FIG. 5 is a circuit diagram of one embodiment of a portion of the PGIA 300 of FIG. 3 including a dielectric absorption (DA) compensation circuit 510 and common mode rejection ratio (CMRR) enhancement circuit 520. Components that correspond to those shown in FIG. 3 are numbered identically for simplicity and clarity. The PGIA 300 may comprise the DA compensation circuit 510 to overcome some of the problems associated with settling time of typical PGIAs due to dielectric absorption, as will be described further below. Also, the PGIA 300 may include the CMRR enhancement circuit 520 to overcome some of the problems associated with low CMRR of typical PGIAs due to asymmetric topology.

In one embodiment, the PGIA 300 of FIG. 5 may comprise the components described above with reference to FIGS. 3 and 4, and in addition, the PGIA 300 may also include the DA compensation circuit 510 and the CMRR enhancement circuit 520. The DA compensation circuit 510 may be coupled in between the output terminal of negative input op-amp 303 and the current source 310. The DA compensation circuit 510 may be an RC circuit and may include resistors 522, 524, and 526 and a capacitor 528. It is noted that in some embodiment the resistors 524 and 526 are optional. In one embodiment, the resistor 526 may be coupled in series with the capacitor 528, and the resistor 526 may be coupled to the junction of the resistors 522 and 524. The CMRR enhancement circuit 520 may be connected in parallel to the DA compensation circuit 510. The CMRR enhancement circuit 520 may be a series RC circuit and may include resistors 502 and 504, and a capacitor 506. It is noted that in some embodiments the PGIA 300 may include only the CMRR enhancement circuitry or the DA compensation circuitry.

It should be noted that the components described with reference to FIG. 5 are meant to be exemplary only, and are not intended to limit the invention to any specific set of components or configurations. For example, in various embodiments, one or more of the components described may be omitted, combined, modified, or additional components included, as desired. For instance, in some embodiments, the type and number of resistors and capacitors may vary, e.g., the resistor 502 of the DA compensation circuit 510 may represent the combination of two resistors in series and the capacitor 506 may represent the combination of two capacitors in parallel.

Figure 6A:
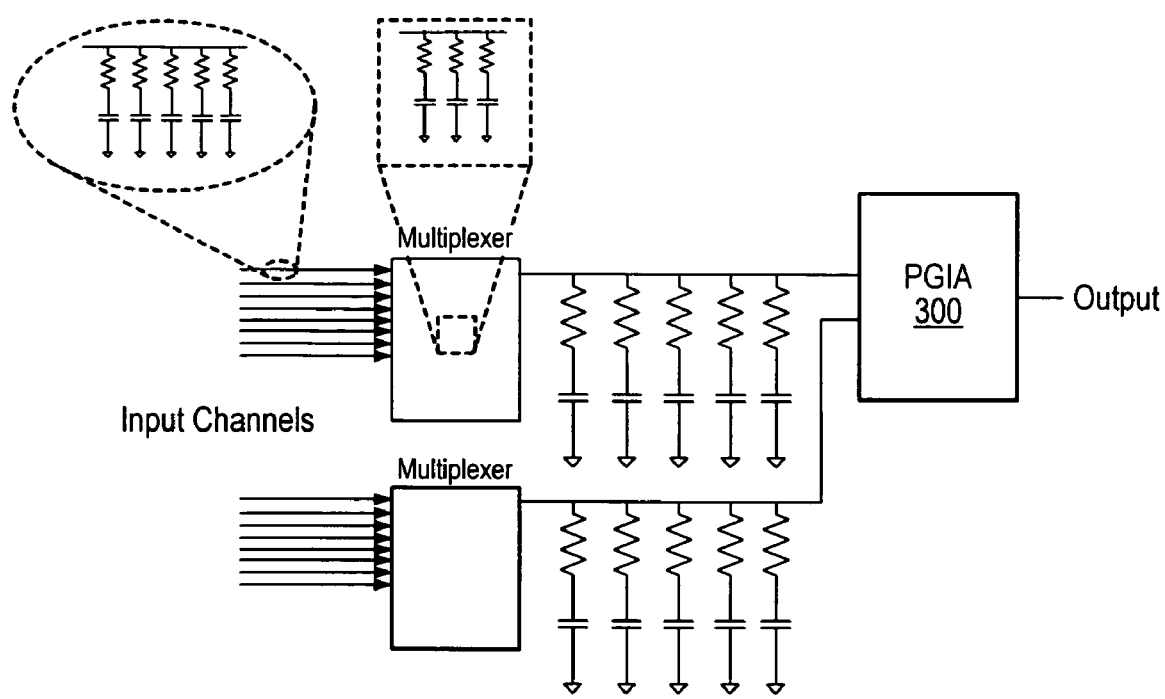
FIG. 6A shows a diagram highlighting typical parasitic capacitors at the input state of the PGIA of FIG. 3.
Figure 6B:
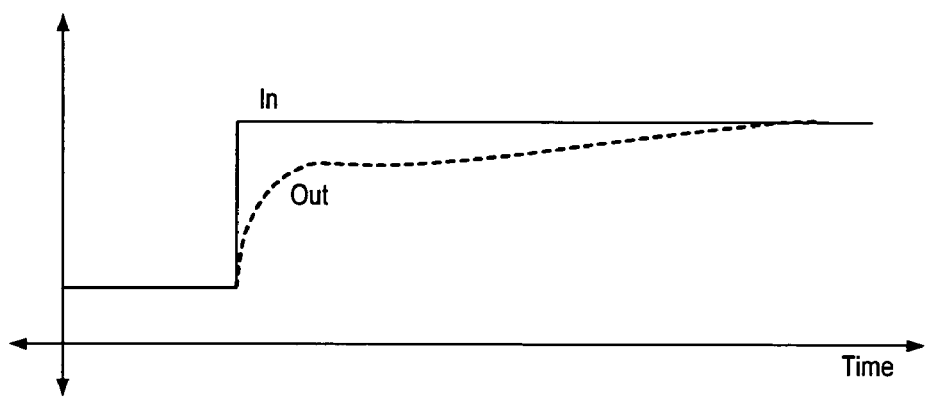
FIG. 6B is a graph showing a slow settling time in typical PGIAs caused by dielectric absorption.

The input stage of the PGIA 300 may include multiple lines, switches, and multiplexers that may add to the dielectric absorption associated with the input, which may slow down the settling time of the PGIA 300. For example, in a multi-channel DAQ device (e.g., DAQ device 102 of FIG. 2), various channels (e.g., 32 channels) may be connected to multiplexers and other circuitry to scan between channels and send received analog signals to the PGIA 300. In this example, the multiple traces and multiplexers may increase the settling time (e.g., when switching from one channel to another) due to dielectric absorption of the circuit. FIG. 6A shows a circuit diagram highlighting typical parasitic capacitors at the input stage of the PGIA 300. Parasitic capacitors may be capacitors that have poor properties, which may cause at least a portion of the dielectric absorption of the circuit. In typical PGIAs, the parasitics from the input multiplexers to the input of the PGIA may have a long time constant due to dielectric absorption, which may cause the settling time to suffer, as illustrated in FIG. 6B. Similar settling time degradation may result from dielectric absorption elsewhere in the circuit as well, such as in the composite amplifier 350 or in an ADC coupled to the PGIA. As shown in FIG. 6B, the signal at the output of a typical PGIA having no DA compensation circuitry may take a substantial amount of time to settle, e.g., due to the parasitic capacitors causing dielectric absorption effects with multiple time constants. If a PGIA has a slow settling time, it may affect the speed and performance of the measurement device, e.g., a data acquisition device.

The PGIA 300 may include the DA compensation circuit 510 to cancel some of the dielectric absorption effects described above that are associated with the negative input of the PGIA. In one embodiment, the PGIA 300 may also include DA compensation circuit 560, which may be coupled to composite amplifier 350. The DA compensation circuit 560 may help reduce the dielectric absorption effects associated with both the negative and positive inputs of the PGIA. The DA compensation circuits 510 and 560 may generate slow-settling tails to compensate for those caused by undesired dielectric absorption. The DA compensation circuitry may compensate for the error with a first order approximation to the inverse of the dielectric absorption error. Thus, the DA compensation circuits 510 and 560 may equalize the step response of the PGIA 300.

To determine what kind of compensation is required to equalize the step response of the overall PGIA 300, a test of the step response at the positive input terminal 304 and then at the negative input terminal 302 may be performed. For example, to test the step response at the positive input terminal 304, a constant voltage (e.g., 0V) is placed at the negative input terminal 302 and a step is applied to the positive input terminal 304. Also, to test the step response at the negative input terminal 302, a constant voltage (e.g., 0V) is placed at the positive input terminal 304 and a step is applied to the negative input terminal 302. Then, in this example, the step responses are compared to each other to determine what kind of compensation is required to equalize them. The desired compensation may be achieved by adjusting the RC values of the DA compensation circuit 510. Then, the equalized responses are compared to a more ideal fast-settling step response to determine how much compensation is required for the rest of the circuit. The desired compensation may be achieved by adjusting the RC values of the DA compensation circuit 560. In one embodiment, after the RC values are adjusted accordingly, the compensation signals may combine with the original response to obtain an overall step response close to the ideal case.

The CMRR of the PGIA 300 depends heavily on the symmetry between the positive and negative inputs of the PGIA 300. As shown in FIG. 3 and FIG. 5, the current-sensing MOSFET 341 may be placed at the negative input side of the PGIA 300, whereas there is typically not a current-sensing MOSFET on the positive input side of PGIA 300. Thus, only the negative input side of PGIA 300 may be sensitive to stray capacitance to ground within the PGIA, notably from gain multiplexer 325, which may add significant phase lead to signals received at the negative input terminal 302 relative to signals received at the positive input terminal 304. Thus, the topology of the PGIA 300 may be asymmetric.

If the topologies at the inputs of the PGIA 300 are asymmetric, the signals (e.g., sinusoids) at the negative and positive input sides of the PGIA 300 may be out of phase. For example, the signal at the positive input side may be lagging the signal at the negative input side. If one of the signals is lagging the other, instead of ignoring the common mode voltage, the PGIA 300 may measure a voltage difference. The voltage difference translates to a voltage drop across the selected gain resistor 330, which will be translated across portions of the PGIA 300 and affect the output of the PGIA 300.

In one embodiment, an equalization technique may be used to achieve as much symmetry as possible at the inputs of the PGIA 300 by placing an RC circuit combination (e.g., the CMRR enhancement circuit 520) at the negative input side, as shown in FIG. 5. If the topology at the inputs of the PGIA 300 is more symmetric, then the CMRR will be greater because the signals at the inputs will be closer to being in phase. The CMRR enhancement circuit 520 may delay an input signal (e.g., a sinusoid) received at the negative input terminal 302 of the PGIA 300 to improve the CMRR of the PGIA 300. More specifically, the CMRR enhancement circuit 520 may delay an input signal received at the negative input terminal 302 by a particular amount such that the input signal received at the negative input terminal 302 will be in phase with an input signal received at the positive input terminal 304 of the PGIA 300. The particular amount of delay provided by the CMRR enhancement circuit 520 may be dependent upon the RC components therein, e.g., resistance values of the resistors 502 and 504, and the capacitance value of the capacitor 506, as well as the value of the selected gain resistor 330. In other words, the CMRR enhancement circuit 520 may cause a compensating phase lag to be applied to signals received at the negative input terminal 302 of the PGIA 300. The result is typically better phase matching between signals received at the two PGIA inputs, and hence improved CMRR.

At lower frequencies, the added delay is typically equal to the product of the values of capacitor 506 and the selected gain resistor 330. At higher frequencies, the resistors 502 and 504 typically decreases the delay somewhat, allowing more flexibility in canceling the natural phase lead of signals on the negative input terminal 302 of PGIA 300. In other embodiments, the addition of further resistors and capacitors may allow even more control over the added phase lag, providing improved CMRR enhancement over a wider range of frequencies.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An instrumentation amplifier for use in a measurement device, the instrumentation amplifier comprising:
   an output terminal; and
   a composite amplifier comprising:
      a first input terminal, and
      an output terminal, wherein the output terminal of the composite amplifier is coupled to the output terminal of the instrumentation amplifier,
      wherein the first input terminal of the composite amplifier is operable to remain at a constant common mode voltage, wherein the composite amplifier is operable to level shift from the constant common mode voltage to a lower common mode voltage with a large voltage swing.

2. The instrumentation amplifier of claim 1, wherein the composite amplifier further comprises:
   a second input terminal,
   a first op-amp,
   a second op-amp, and
   a first transistor,
   wherein an inverting input terminal of the first op-amp is coupled to the first input terminal of the composite amplifier and to the first transistor, a noninverting input terminal of the first op-amp is coupled to the second input terminal of the composite amplifier, a noninverting input terminal of the second op-amp is coupled to an output terminal of the first op-amp, an inverting terminal of the second op-amp is coupled to the first transistor, and an output terminal of the second op-amp is coupled to the output terminal of the composite amplifier.

3. The instrumentation amplifier of claim 1, wherein the composite amplifier further comprises:
   a second input terminal,
   a first op-amp,
   a second op-amp, and
   a first MOSFET,
   wherein an inverting input terminal of the first op-amp is coupled to the first input terminal of the composite amplifier and to a gate terminal of the first MOSFET, a noninverting input terminal of the first op-amp is coupled to the second input terminal of the composite amplifier, a noninverting input terminal of the second op-amp is coupled to an output terminal of the first op-amp, an inverting terminal of the second op-amp is coupled to a source terminal of the first MOSFET, and an output terminal of the second op-amp is coupled to the output terminal of the composite amplifier.

4. The instrumentation amplifier of claim 3, further comprising:
   a negative input terminal,
   a second MOSFET, and
   a third op-amp including a noninverting input terminal, an inverting input terminal, and an output terminal, wherein one of the input terminals of the third op-amp is coupled to the negative input terminal of the instrumentation amplifier,
   wherein the first input terminal of the composite amplifier is coupled to a drain terminal of the second MOSFET, and a gate terminal of the second MOSFET is coupled to the output terminal of the third op-amp.

5. The instrumentation amplifier of claim 3, wherein the first op-amp is configured as a precision op-amp and the second op-amp is configured as a high-speed op-amp.

6. The instrumentation amplifier of claim 1, wherein the first input terminal of the composite amplifier is operable to remain at a constant common mode voltage of twelve volts.

7. The instrumentation amplifier of claim 1, wherein the composite amplifier is operable to level shift from the constant common mode voltage to a lower common mode voltage, including a superimposed signal having a large voltage swing of twenty volts, to improve a signal-to-noise ratio associated with an output signal of the instrumentation amplifier.

8. The instrumentation amplifier of claim 1, wherein the composite amplifier allows level shifting, scaling, and current-to-voltage conversion to be combined into a single stage.

9. The instrumentation amplifier of claim 1, further comprising:
   a negative input terminal;
   a positive input terminal;
   a third op-amp comprising a noninverting input terminal, an inverting input terminal, and an output terminal, wherein one of the input terminals of the third op-amp is coupled to the negative input terminal of the instrumentation amplifier; and
   a fourth op-amp comprising a noninverting input terminal, an inverting input terminal, and an output terminal, wherein one of the input terminals of the fourth op-amp is coupled to the positive input terminal of the instrumentation amplifier.

10. The instrumentation amplifier of claim 9, further comprising a first protection circuit coupled to the output terminal of the fourth op-amp to protect the instrumentation amplifier from over-current conditions.

11. The instrumentation amplifier of claim 9, further comprising a second protection circuit coupled to the output terminal of the third op-amp to protect the instrumentation amplifier from over-current conditions.

12. The instrumentation amplifier of claim 9, wherein the third and the fourth op-amps are bootstrapped so that supply rails associated with each of the third and fourth op-amps move according to an input signal of the instrumentation amplifier.

13. The instrumentation amplifier of claim 9, further comprising a dielectric absorption (DA) compensation circuit coupled to the output terminal of the third op-amp, wherein the DA compensation circuit is operable to compensate for a dielectric absorption error and improve a step response of the instrumentation amplifier with a first order approximation to an inverse of the dielectric absorption error.

14. The instrumentation amplifier of claim 13, further comprising a common-mode rejection ratio (CMRR) enhancement circuit coupled in parallel to the DA compensation circuit, wherein the CMRR enhancement circuit is operable to delay an input received at the negative input terminal of the instrumentation amplifier to improve a CMRR of the instrumentation amplifier.

15. The instrumentation amplifier of claim 14, wherein the CMRR enhancement circuit is operable to delay the input signal received at the negative input terminal a particular amount such that the input signal received at the negative input terminal will be in phase with an input signal received at the positive input terminal of the instrumentation amplifier, to improve the CMRR of the instrumentation amplifier.

16. The instrumentation amplifier of claim 1, configured as a programmable gain instrumentation amplifier (PGIA).

17. The instrumentation amplifier of claim 4, further comprising a single current source, wherein the current source is coupled to a source terminal of the second MOSFET.

18. A data acquisition device, comprising:
one or more analog-to-digital converters (ADCs) operable to convert received analog data into digital data; and
a programmable gain instrumentation amplifier (PGIA) coupled to the one or more ADCs, the PGIA comprising:
an output terminal, and
a composite amplifier comprising:
a first input terminal, and
an output terminal, wherein the output terminal of the composite amplifier is coupled to the output terminal of the PGIA,
wherein the first input terminal of the composite amplifier is operable to remain at a constant common mode voltage, wherein the composite amplifier is operable to level shift from the constant common mode voltage to a lower common mode voltage with a large voltage swing.

19. The data acquisition device of claim 18, wherein the composite amplifier further comprises:
a second input terminal,
a first op-amp,
a second op-amp, and
a first transistor,
wherein an inverting input terminal of the first op-amp is coupled to the first input terminal of the composite amplifier and to the first transistor, a noninverting input terminal of the first op-amp is coupled to the second input terminal of the composite amplifier, a noninverting input terminal of the second op-amp is coupled to an output terminal of the first op-amp, an inverting terminal of the second op-amp is coupled to the first transistor, and an output terminal of the second op-amp is coupled to the output terminal of the composite amplifier.

20. The data acquisition device of claim 18, wherein the first input terminal of the composite amplifier is operable to remain at a constant common mode voltage of twelve volts.

21. The data acquisition device of claim 18, wherein the composite amplifier is operable to level shift from the constant common mode voltage to a lower common mode voltage, including a superimposed signal having a large voltage swing of twenty volts, to improve a signal-to-noise ratio associated with an output signal of the PGIA.

22. The data acquisition device of claim 18, wherein the composite amplifier allows level shifting, scaling, and current-to-voltage conversion to be combined into a single stage.

23. The data acquisition device of claim 18, wherein the PGIA further comprises:
a negative input terminal;
a positive input terminal;
a third op-amp comprising a noninverting input terminal, an inverting input terminal, and an output terminal, wherein one of the input terminals of the third op-amp is coupled to the negative input terminal of the PGIA; and
a fourth op-amp comprising a noninverting input terminal, an inverting input terminal, and an output terminal, wherein one of the input terminals of the fourth op-amp is coupled to the positive input terminal of the PGIA.

24. The data acquisition device of claim 23, further comprising a first protection circuit coupled to the output terminal of the fourth op-amp to protect the PGIA from over-current conditions.

25. The data acquisition device of claim 23, further comprising a second protection circuit coupled to the output terminal of the third op-amp to protect the PGIA from over-current conditions.

26. The data acquisition device of claim 23, wherein the third and the fourth op-amps are bootstrapped so that supply rails associated with each of the third and fourth op-amps move according to an input signal of the PGIA.

27. The data acquisition device of claim 23, further comprising a DA compensation circuit coupled to the output terminal of the third op-amp, wherein the DA compensation circuit is operable to compensate for a dielectric absorption error and improve a step response of the PGIA with a first order approximation to an inverse of the dielectric absorption error.

28. The data acquisition device of claim 27, further comprising a CMRR enhancement circuit coupled in parallel to the DA compensation circuit, wherein the CMRR enhancement circuit is operable to delay an input received at the negative input terminal of the PGIA to improve a CMRR of the PGIA.

29. The data acquisition device of claim 28, wherein the CMRR enhancement circuit is operable to delay the input signal received at the negative input terminal a particular amount such that the input signal received at the negative input terminal will be in phase with an input signal received at the positive input terminal of the PGIA, to improve the CMRR of the PGIA.

30. The data acquisition device of claim 18, comprised in a data acquisition system including a computer system for processing data obtained from one or more data acquisition processes.

31. The data acquisition device of claim 30, comprised in a data acquisition system further including a unit under test (UUT), wherein the UUT includes a sensor operable to provide the data acquisition device with sensor data.

32. The data acquisition device of claim 18, wherein the PGIA further comprises a single current source.

33. The data acquisition device of claim 18, wherein the PGIA further comprises a clamping circuit coupled between the first input terminal and the output terminal of the composite amplifier.

34. A PGIA for use in a data acquisition device, the PGIA comprising:
an output terminal; and
a composite amplifier comprising a first input terminal, a second input terminal, and an output terminal, wherein the output terminal of the composite amplifier is coupled to the output terminal of the PGIA, wherein the composite amplifier also comprises a first op-amp, a second op-amp, and a transistor, wherein an inverting input terminal of the first op-amp is coupled to the first input terminal of the composite amplifier and to the transistor, a noninverting input terminal of the first op-amp is coupled to the second input terminal of the composite amplifier, a noninverting input terminal of the second op-amp is coupled to an output terminal of the first op-amp, an inverting terminal of the second op-amp is coupled to the transistor, and an output terminal of the second op-amp is coupled to the output terminal of the composite amplifier.

35. A PGIA for use in a data acquisition device, the PGIA comprising:
    a negative input terminal;
    a positive input terminal;
    an output terminal;
    a composite amplifier comprising a first input terminal, a second input terminal, and an output terminal, wherein the output terminal of the composite amplifier is coupled to the output terminal of the PGIA, wherein the composite amplifier also comprises a first op-amp, a second op-amp, and a transistor, wherein an inverting input terminal of the first op-amp is coupled to the first input terminal of the composite amplifier and to the transistor, a noninverting input terminal of the first op-amp is coupled to the second input terminal of the composite amplifier, a noninverting input terminal of the second op-amp is coupled to an output terminal of the first op-amp, an inverting terminal of the second op-amp is coupled to the transistor, and an output terminal of the second op-amp is coupled to the output terminal of the composite amplifier;
    a third op-amp comprising a noninverting input terminal, an inverting input terminal, and an output terminal, wherein one of the input terminals of the third op-amp is coupled to the negative input terminal of the PGIA;
    a fourth op-amp comprising a noninverting input terminal, an inverting input terminal, and an output terminal, wherein one of the input terminals of the fourth op-amp is coupled to the positive input terminal of the PGIA;
    a first protection circuit coupled to the output terminal of the fourth op-amp to protect the PGIA from overcurrent conditions; and
    a second protection circuit coupled to the output terminal of the third op-amp to protect the PGIA from overcurrent conditions;
    wherein the third and the fourth op-amps are bootstrapped so that supply rails associated with each of the third and fourth op-amps move according to an input signal of the PGIA.

36. A data acquisition device, comprising:
    one or more analog-to-digital converters (ADCs) operable to convert received analog data into digital data; and
    a programmable gain instrumentation amplifier (PGIA) coupled to the one or more ADCs, the PGIA comprising:
        a negative input terminal;
        a positive input terminal;
        an output terminal;
        a composite amplifier comprising a first input terminal, a second input terminal, and an output terminal, wherein the output terminal of the composite amplifier is coupled to the output terminal of the PGIA, wherein the composite amplifier also comprises a first op-amp, a second op-amp, and a transistor, wherein an inverting input terminal of the first op-amp is coupled to the first input terminal of the composite amplifier and to the transistor, a noninverting input terminal of the first op-amp is coupled to the second input terminal of the composite amplifier, a noninverting input terminal of the second op-amp is coupled to an output terminal of the first op-amp, an inverting terminal of the second op-amp is coupled to the transistor, and an output terminal of the second op-amp is coupled to the output terminal of the composite amplifier;
        a third op-amp comprising a noninverting input terminal, an inverting input terminal, and an output terminal, wherein one of the input terminals of the third op-amp is coupled to the negative input terminal of the PGIA;
        a fourth op-amp comprising a noninverting input terminal, an inverting input terminal, and an output terminal, wherein one of the input terminals of the fourth op-amp is coupled to the positive input terminal of the PGIA;
        a DA compensation circuit coupled to the output terminal of the third op-amp, wherein the DA compensation circuit is operable to compensate for a dielectric absorption error and improve a step response of the PGIA with a first order approximation to an inverse of the dielectric absorption error; and
        a CMRR enhancement circuit coupled in parallel to the DA compensation circuit, wherein the CMRR enhancement circuit is operable to delay an input received at the negative input terminal of the PGIA to improve a CMRR of the PGIA.

37. An instrumentation amplifier for use in a measurement device, the instrumentation amplifier comprising:
    a gain multiplexer;
    a negative input terminal;
    a positive input terminal;
    a third op-amp comprising a noninverting input terminal, an inverting input terminal, and an output terminal, wherein one of the input terminals of the third op-amp is coupled to the positive input terminal of the instrumentation amplifier; and
    a first protection circuit coupled between the output terminal of the third op-amp and the gain multiplexer, wherein the first protection circuit includes a plurality of transistors, wherein a collector terminal of a first transistor is coupled to the output terminal of the third op-amp and an emitter terminal of the first transistor is coupled to an emitter terminal of a second transistor, wherein a base terminal of the first transistor is coupled to a base terminal of the second transistor, wherein a collector terminal of the second transistor is coupled to the gain multiplexer, wherein a collector terminal of a third transistor is coupled to the output terminal of the third op-amp, to a base terminal of the third transistor, and to the collector terminal of the first transistor, wherein an emitter terminal of the third transistor is coupled to a collector terminal a fourth transistor, wherein a base terminal of the fourth transistor is coupled to the collector terminal of the fourth transistor, wherein an emitter terminal of the fourth transistor is coupled to one of the input terminals of the third op-amp to form a feedback path, wherein the emitter terminal of the fourth transistor is coupled to a fifth transistor, wherein the fifth transistor is coupled to the gain multiplexer;
    wherein the first protection circuit is operable to isolate the third op-amp from the gain multiplexer during overload conditions, wherein in response to an overload condition the first and second transistors and the fifth transistor turn off to isolate the third op-amp from the gain multiplexer, and the third and fourth transistors turn on to open the feedback path to one of the input terminals of the third op-amp.

* * * * *